US009396900B2

United States Patent
Lane et al.

(10) Patent No.: US 9,396,900 B2
(45) Date of Patent: Jul. 19, 2016

(54) RADIO FREQUENCY (RF) POWER COUPLING SYSTEM UTILIZING MULTIPLE RF POWER COUPLING ELEMENTS FOR CONTROL OF PLASMA PROPERTIES

(71) Applicant: Tokyo Electron Limited, Tokyo (JP)

(72) Inventors: Barton Lane, Austin, TX (US); Lee Chen, Cedar Creek, TX (US); Peter L. G. Ventzek, Austin, TX (US); Merritt Funk, Austin, TX (US); Jianping Zhao, Austin, TX (US); Radha Sundararajan, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 670 days.

(21) Appl. No.: 13/676,265

(22) Filed: Nov. 14, 2012

(65) Prior Publication Data

US 2013/0119854 A1    May 16, 2013

Related U.S. Application Data

(60) Provisional application No. 61/560,290, filed on Nov. 16, 2011, provisional application No. 61/578,739, filed on Dec. 21, 2011.

(51) Int. Cl.
| | |
|---|---|
| *H01J 7/24* | (2006.01) |
| *H05B 31/26* | (2006.01) |
| *H01J 1/00* | (2006.01) |
| *H01J 37/32* | (2006.01) |
| *H05H 1/46* | (2006.01) |

(52) U.S. Cl.
CPC .............. *H01J 1/00* (2013.01); *H01J 37/321* (2013.01); *H01J 37/32082* (2013.01); *H01J 37/32091* (2013.01); *H01J 37/32174* (2013.01); *H05H 1/46* (2013.01); *H05H 2001/4652* (2013.01); *H05H 2001/4675* (2013.01)

(58) Field of Classification Search
CPC ........ C23C 16/509; C23C 4/00; C23C 16/50; H02J 3/00; H01L 21/00
USPC ......... 118/723 E, 712; 315/111.21, 326, 160; 427/570, 569; 438/711
See application file for complete search history.

(56) References Cited

U.S. PATENT DOCUMENTS

| | | | |
|---|---|---|---|
| 6,863,020 B2 | 3/2005 | Mitrovic et al. | |
| 2002/0170676 A1* | 11/2002 | Mitrovic et al. | ......... 156/345.47 |
| 2003/0137251 A1 | 7/2003 | Mitrovic et al. | |
| 2009/0202741 A1* | 8/2009 | Stimson et al. | ............... 427/569 |
| 2011/0192349 A1* | 8/2011 | Hammond et al. | ....... 118/723 E |

FOREIGN PATENT DOCUMENTS

EP         0342113      * 11/1989      .......... C23C 16/5069

* cited by examiner

*Primary Examiner* — Alexander H Taningco
*Assistant Examiner* — Renan Luque
(74) *Attorney, Agent, or Firm* — Wood, Herron & Evans, LLP

(57) ABSTRACT

A radio frequency (RF) power coupling system is provided. The system has an RF electrode configured to couple RF power to plasma in a plasma processing system, multiple power coupling elements configured to electrically couple RF power at multiple power coupling locations on the RF electrode, and an RF power system coupled to the multiple power coupling elements, and configured to couple an RF power signal to each of the multiple power coupling elements. The multiple power coupling elements include a center element located at the center of the RF electrode and peripheral elements located off-center from the center of the RF electrode. A first peripheral RF power signal differs from a second peripheral RF power signal in phase.

18 Claims, 5 Drawing Sheets

RADIO FREQUENCY (RF) POWER COUPLING SYSTEM UTILIZING MULTIPLE RF POWER COUPLING ELEMENTS FOR CONTROL OF PLASMA PROPERTIES

CROSS-REFERENCE TO RELATED APPLICATIONS

Pursuant to 37 C.F.R. §1.78(a)(4), this application claims the benefit of and priority to prior filed Provisional Application Ser. No. 61/560,290 filed Nov. 16, 2011, and Provisional Application Ser. No. 61/578,739 filed Dec. 21, 2011, both of which are expressly incorporated herein by reference.

FIELD OF THE INVENTION

The present invention relates to a system and method for coupling radio frequency (RF) power to plasma in a plasma processing system.

BACKGROUND

When coupling RF power via an RF electrode (for example, in a plasma processing apparatus), a voltage standing wave, $V_{RF}(r)$, occurs on the RF electrode surface. The voltage standing wave is typically radial (usually with azimuthal symmetry) with its maximum at the electrode center (r=0). Its current conjugate, $I_{RF}(r)$, has its minimum value at r=0. A problem of energy spatial distribution arises when the flat-electrode RF wavelength (not its free-space wavelength) becomes shortened to a dimension within about ten times the electrode radius. However, this relatively flat-electrode RF wavelength may still produce poor energy spatial distribution when dimensioned greater than or less than 10×.

When the RF frequency becomes high, for example, in the VHF range (about 30 MHz to about 300 MHz, e.g., 100 MHz), and is used in conjunction with plasma processing of large format wafers (or substrates), the observance of non-uniform spatial energy distribution becomes readily apparent. For example, the voltage at r=center (of the substrate) becomes noticeably higher than the voltage at r=edge (of the substrate). Since the problem is electromagnetic, the non-uniformity has a current-conjugate as well. The r=edge RF current becomes noticeably higher than the r=0 RF current (RF current is 0 at r=0). The standing wave energy spatial distribution problem primarily results from the voltage standing wave effect, causing a stronger capacitive mode in the center; and edge skin effect, causing a stronger inductive mode at the edge.

This irregular spatial energy distribution results in non-uniform plasma distributions, and as a result, irregular substrate processing characteristics. Therefore, an improved apparatus and method for improving RF energy uniformity is needed.

SUMMARY OF THE INVENTION

A radio frequency (RF) power coupling system is provided. The system comprises an RF electrode configured to couple RF power to plasma in a plasma processing system, multiple power coupling elements configured to electrically couple RF power at multiple power coupling locations on the RF electrode, and an RF power system coupled to the multiple power coupling elements, and configured to couple an RF power signal to each of the multiple power coupling elements. The multiple power coupling elements comprise a center element located at the center of the RF electrode and m peripheral elements located off-center from the center of the RF electrode, wherein m is an integer greater than one. A center RF power signal is coupled to the center element, and the center RF power signal contains a center frequency. A first peripheral RF power signal is coupled to a first peripheral element of the m peripheral elements, and the first peripheral RF power signal contains a first peripheral frequency different than the center frequency. A second peripheral RF power signal is coupled to a second peripheral element of the m peripheral elements, and the second peripheral RF power signal contains a second peripheral frequency that is substantially equivalent to the first peripheral frequency. The first peripheral RF power signal differs from the second peripheral RF power signal in phase.

A method of operating a radio frequency (RF) power coupling system is provided. The method comprises providing an RF electrode in a plasma processing system, wherein the RF electrode is configured to couple RF power to plasma in the plasma processing system. The method also includes the step of providing multiple power coupling elements configured to electrically couple RF power at multiple power coupling locations on the RF electrode, wherein the multiple power coupling elements comprise a center element located at the center of the RF electrode and m peripheral elements located off-center from the center of the RF electrode, wherein m is an integer greater than one. The method further includes providing an RF power system coupled to the multiple power coupling elements, and configured to couple an RF power signal to each of the multiple power coupling elements. Further, a center RF power signal containing a center frequency is coupled to the center element. A first peripheral RF power signal containing a first peripheral frequency different than the center frequency is coupled to a first peripheral element of the m peripheral elements, and a second peripheral RF power signal containing a second peripheral frequency that is substantially equivalent to the first peripheral frequency is coupled to a second peripheral element of the m peripheral elements. The method lastly includes the step of varying at least one of a phase difference or an amplitude difference between the first peripheral RF power signal and the second peripheral RF power signal in phase.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

For the discussion that follows, $N_e(r)$ refers to the plasma density (or electron density) spatial distribution function, and $N_e$ refers to electron energy in a discrete area. IEDf(r) refers to the spatial distribution function of the on-wafer ion energy distribution. This invention provides a system and method to adjust a plasma processing property, such as the IEDf(r) uniformity, and adjust electron density, $N_e(r)$, uniformity. The present invention utilizes multiple RF or VHF power feed (coupling) locations of variable phase, frequency, and amplitude, to overcome deleterious wavelength effects on the $V_{RF}$(r) and hence, the IEDf(r) and $N_e(r)$.

Figure 1:
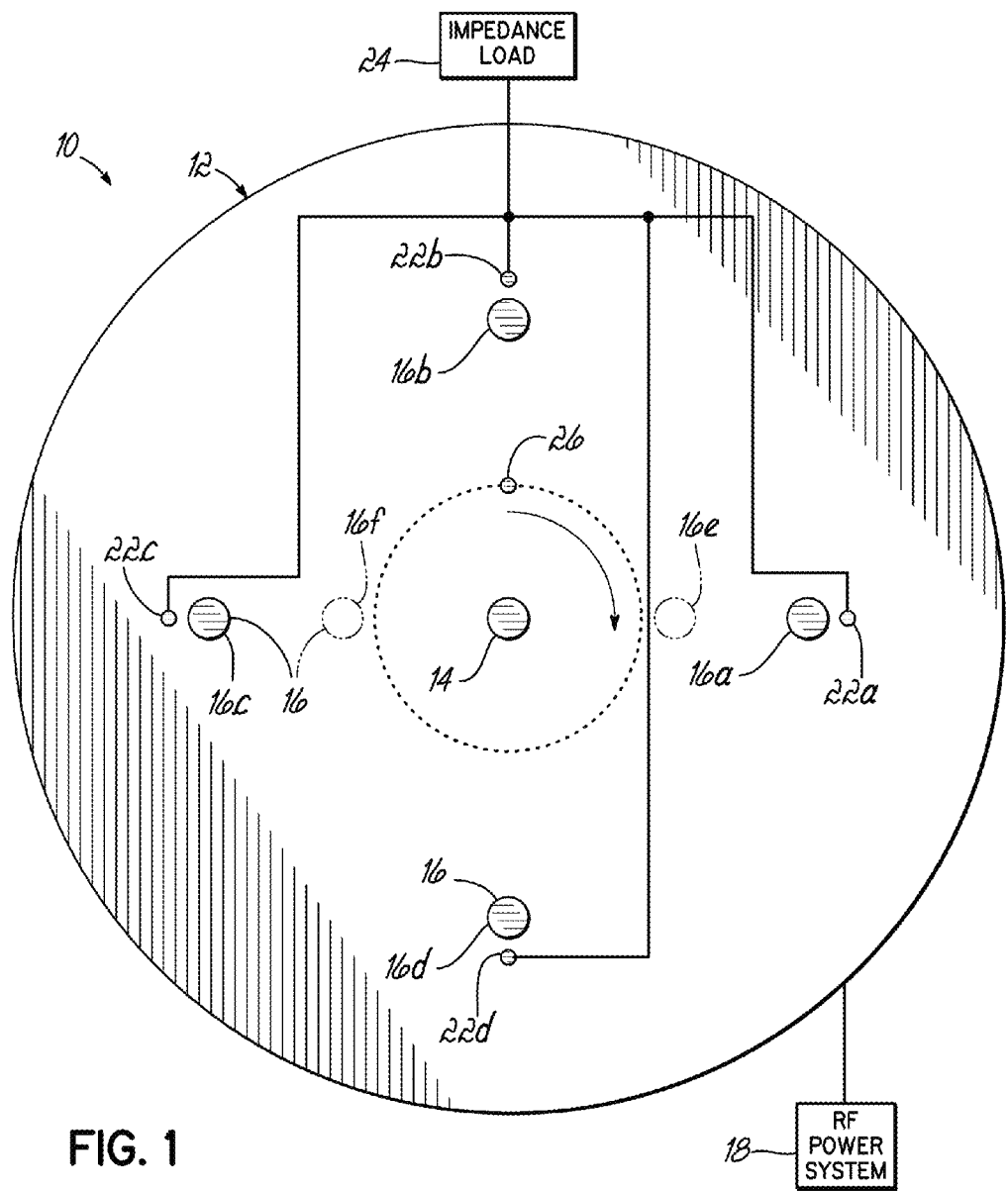
FIG. 1 is a plan view of an embodiment of the invention.

FIG. 1 shows an embodiment of the disclosed radio frequency power coupling system 10 utilizing an RF electrode 12 coupled to multiple power coupling elements. The power coupling elements include a center element 14, and a plurality (m) of peripheral elements 16, each located at a radial distance from the center element 14. In the embodiment shown, four peripheral elements (m=4) are depicted, labeled 16a-16d; however any plurality (m>1) may be used. The center element 14 and peripheral elements 16a-16d are collectively used to couple (feed) power to the RF electrode 12, but each of the multiple power coupling elements 14 and 16a-16d are energized by an RF signal of varying amplitude and phase shift (a phasor), as will be described in detail below.

In this illustration, the four peripheral elements 16a-16d are disposed at a fixed radial distance from the center element 14, and each of the peripheral elements 16a-16d are distributed at equal angular intervals to yield radial and azimuthal symmetry (the four peripheral elements 16a-16d are symmetrically disposed at 0, $\pi/2$, $\pi$, and $3\pi/2$ radians). These peripheral elements 16a-16d are used in conjunction with the center element 14 to establish an improved uniformity $N_e(r)$.

Additionally, the peripheral elements 16 need not be limited to one element per angular location (leg). For example, in some embodiments, it may be desirable to position a plurality of peripheral elements 16 at a given angular location or radial leg at differing radial distances from the center element 14. For example, an additional peripheral element 16e can be positioned on the 0 radian leg and an additional peripheral element 16f can be positioned on the $\pi$ radian leg (optional additional elements 16e-16f are shown in FIG. 1 in phantom). The additional peripheral elements 16e, 6f can be at the same or different radial locations from each other. While much of following discussion will be directed at symmetric configurations, it should be understood that asymmetric configurations may be employed to produce certain desirable non-uniformities when used in a semiconductor processing system. For example, the peripheral elements 16 may not be positioned at the same radial distance from the center element 14.

An RF power system 18 is coupled to the multiple (i.e., plurality of) power coupling elements 14 and 16, and configured to provide independent RF power signals to each of the elements 14 and 16a-16d. As described above, if center element 14 is used independently in a plasma processing system and driven with a 100 MHz sinusoidal signal, the plasma distribution would have a high density at r=0 and a low density at r=edge.

Figure 3:
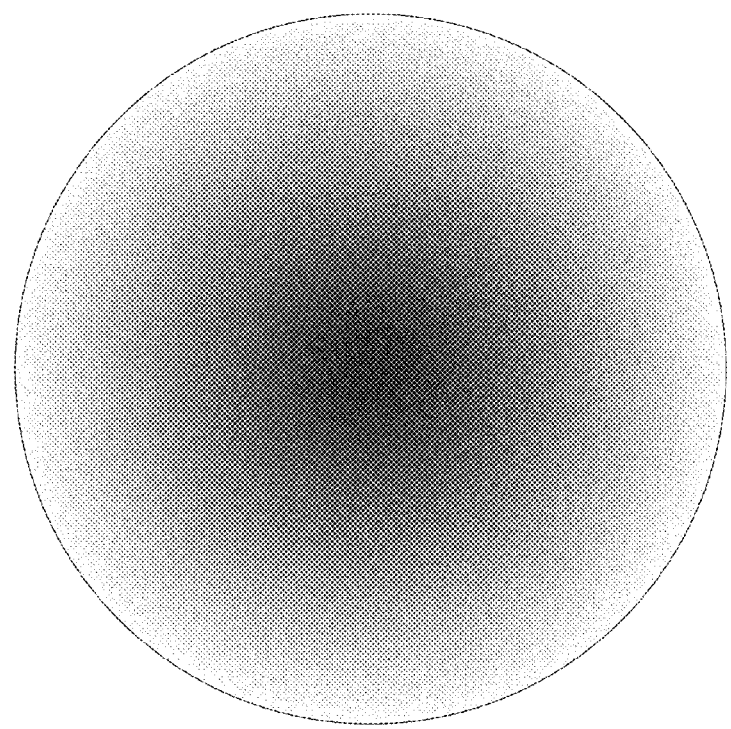
FIG. 3 is a pictorial representation of the plasma density generated by a center coupling element.
Figure 2:
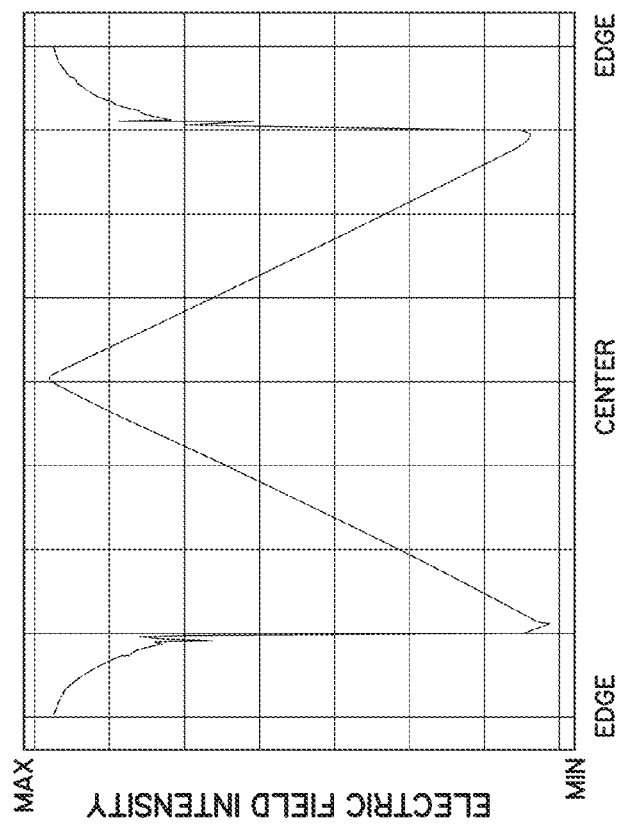
FIG. 2 is a line graph representing the electric field generated by a center power coupling element.

In use, the center element 14 is energized by the RF power system 18 with a center RF power signal having a center amplitude and center frequency. At this point, if peripheral elements 16 are not employed, the resulting IEDf(r) and the $N_e(r)$, as noted above, can be illustrated by computer modeling, as shown in FIGS. 2-3. FIG. 2 shows that the resultant voltage is highest with respect to the center of the electrode (and correspondingly, the center of a processed substrate), and lowest near the edges. Likewise, the plasma density $N_e(r)$ is shown pictorially in FIG. 3, wherein a high plasma density is found near the center of the processed substrate, and a low density is found at the edges of the substrate.

Returning attention to FIG. 1, to ameliorate those non-uniformities, it is possible to generate an IEDf(r) and $N_e(r)$ that is substantially inverted with respect to those shown in FIGS. 2 and 3. By summing the IEDf(r) and $N_e(r)$ produced by the center element 14, with its inverse, a substantially flat or uniform IEDf(r) and $N_e(r)$ will result.

To that end, a first peripheral element 16a is energized by the RF power system 18 with a first peripheral amplitude, a first peripheral frequency, and a first peripheral phase (the first peripheral element 16a will be the reference location, so its phase shall be zero). Likewise, the second peripheral element 16c is energized by the RF power system 18 with a second peripheral amplitude, a second peripheral frequency, and a second peripheral phase. Similar nomenclature (third peripheral amplitude, third peripheral frequency, etc.) shall apply to each of the other plurality of peripheral elements 16b and 16d.

Figure 5:
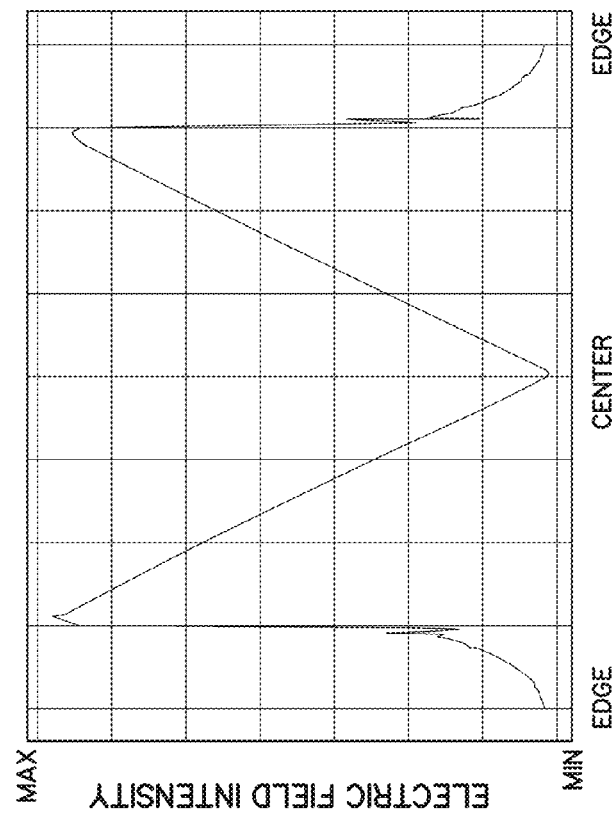
FIG. 5 is a pictorial representation of the plasma density generated by a plurality of power coupling elements.
Figure 4:
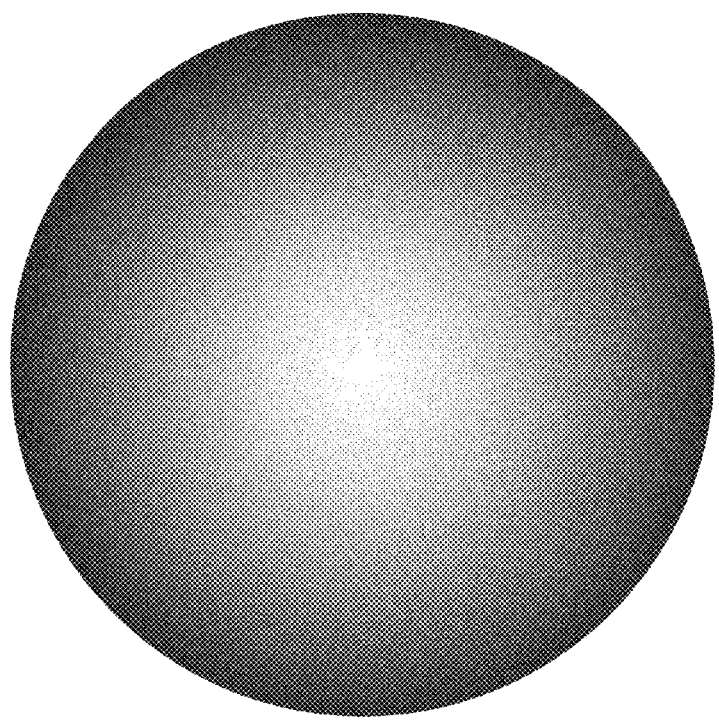
FIG. 4 is a line graph representing the electric field generated by a plurality of peripheral power coupling elements.

The peripheral elements 16 may be driven by the RF power system 18 with substantially equal amplitudes (throughout this discussion, "substantially" shall be read to include deviations from true equivalency that may result from manufacturing tolerances, environmental variations, or RF drift). However, under certain circumstances, for example to compensate for $N_e(r)$ caused by irregularities or asymmetric structures attached to processing chamber wall, the individual amplitudes of peripheral elements 16a-16d may be manipulated to enhance uniformity. With the center element 14 de-energized, the peripheral elements 16a-16d can be configured to produce a $N_e(r)$ that is high at r=edge, and low at r=0 by adjusting the individual phase components supplied by the RF power system 18. This phenomenon, illustrated by computer modeling, is shown in FIGS. 4-5. FIG. 4 shows that the resultant voltage is lowest with respect to the center of the electrode (and correspondingly, the center of a processed substrate), and highest near the edges. Likewise, the plasma density $N_e(r)$ is shown pictorially in FIG. 5, wherein a low plasma density is found near the center of the processed substrate, and a high density is found at the edges of the substrate.

In one embodiment, each of the peripheral elements 16a-16d are driven with phases of 0, $\pi/2$, $\pi$, and $3\pi/2$ radians, respectively (regardless of the number m of peripheral elements 16, a progressive phase shift of $2\pi/m$ may produce acceptable results). By doing so, the RF power signals provided to the individual peripheral elements 16 constructively and destructively combine in a processing chamber to yield an $N_e(r)$ that is high at r=edge, and low at r=0. By operating the peripheral elements 16 in this manner, while simultaneously energizing the center element 14, an $N_e(r)$ with enhanced uniformity is produced. If minor irregularities of $V_{RF}$ as a function of angular position are detected, the irregularities could be corrected by changing the peripheral phase of the peripheral elements 16 by a few degrees away from the original interval of $\pi/2$.

Phase may be manipulated by using a low-power signal generator, feeding the low-power signal into an amplifier, and then connecting the amplified signal to an impedance matching network. Each of the plurality of amplified and impedance-matched signals may then be coupled to the RF electrode 12, through the multiple power coupling elements 14 and 16. Alternatively, a single high-power signal may be split and phase-shifted using lumped circuit elements, or by utilizing varying cable lengths between the signal source and the RF electrode 12 and elements 14 and 16. Additional techniques, as readily apparent to one of ordinary skill in the art, may be selected based upon appropriate design considerations.

While the previous examples of utilizing multiple elements 14 and 16 have been described with reference to a solid electrode, the system and methods of the invention may be modified to include a segmented electrode to achieve additional variability of a plasma processing property. For example, the RF electrode 12 may be modified to include a center segment in which the center element 14 resides, and one or more peripheral segments each containing at least one peripheral element.

Figure 6:
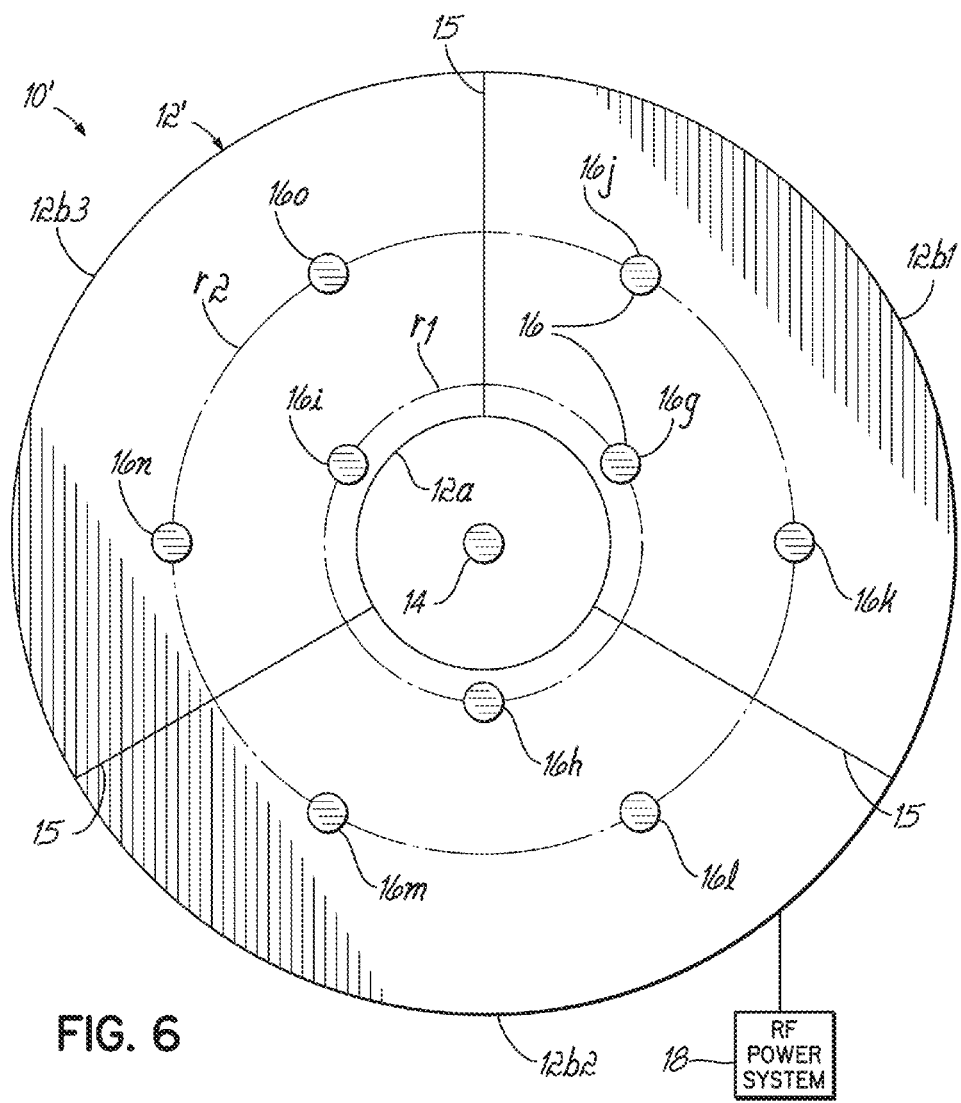
FIG. 6 is a plan view of another embodiment of the invention.

With attention to system 10' shown in FIG. 6, one embodiment of a multi-segment electrode 12' has a center segment 12a in which resides center element 14 and three peripheral segments 12b1, 12b2, and 12b3 in which reside the plurality of peripheral elements 16. In this example, there are nine peripheral elements (i.e., m=9), with three elements 16 in each of the peripheral segments 12b1, 12b2, and 12b3. Three peripheral elements 16g-16i ($m_1$=3) are disposed at a first radial distance r1. Each of the peripheral elements 16g-16i is positioned symmetrically about the circumference of r1 (in increments of $2\pi/3$), and each is centered within the parting lines 15 of the peripheral segments 12b1-12b3, respectively.

Additionally, six peripheral elements 16j-16o ($m_2$=6) are disposed at a second radial distance r2. Each of the peripheral elements 16j-16o is positioned symmetrically about the circumference of r2 (in increments of $2\pi/6$), and each pair of 16j and 16k, 16l and 16m, and 16n and 16o is centered within the parting lines 15 of the peripheral segments 12b1-122b3, respectively. The system 10' includes an RF power system coupled to the plurality of elements 14 and 16j-16o.

In one embodiment, the RF power system 18 of the system 10' may be configured to provide a center frequency to the center element 14, and to provide a common peripheral frequency to the plurality of peripheral elements 16j-16o. Additionally, the phase of the RF signal applied to the center element 14 may be arbitrary, while the phase shift of the RF signal applied to each of the peripheral elements 16j-16o may be progressively incremented at the rate of $2\pi/m_1$ and $2\pi/m_2$, respectively. In this embodiment, $m=m_1+m_2$; $m_1$ refers to number of peripheral elements 16 located at r1 (i.e., three) and $2\pi/m_1$ determines the phase or angular interval spacing at r1 (i.e., $2\pi/3$ radians); and $m_2$ refers to the number of peripheral elements 16 located at r2 (i.e., six) and $2\pi/m_2$ determines the phase or angular interval spacing at r2 (i.e., $2\pi/6$ radians). As a result, in this exemplary embodiment, peripheral elements 16g-16i are driven at phases of 0, $2\pi/3$, and $4\pi/3$ radians, respectively, while peripheral elements 16j-16o are driven at 0, $\pi/3$, $2\pi/3$, $\pi$, $4\pi/3$, $5\pi/3$ radians, respectively. As shown, the phases (angular interval) may be determined at each radial location, using $2\pi/m_x$ where x is the number of radial locations at which elements 16 are positioned. Thus, the angular intervals are equally spaced at each radial location, but not necessarily for all peripheral elements m. Alternatively, all peripheral elements m may be positioned at equally spaced angular intervals regardless of radial position, i.e., regardless of position on the radial leg. Thus, the nine peripheral elements 16j-16o in FIG. 6 may be positioned along nine respective radial legs positioned at angular intervals of $2\pi/9$. Each of the configuration variables that were noted in the discussion of system 10 and FIG. 1 above, to include varying frequencies, phases, amplitudes, and mechanical or electrical rotation, can be advantageously applied to system 10'.

Figure 7:
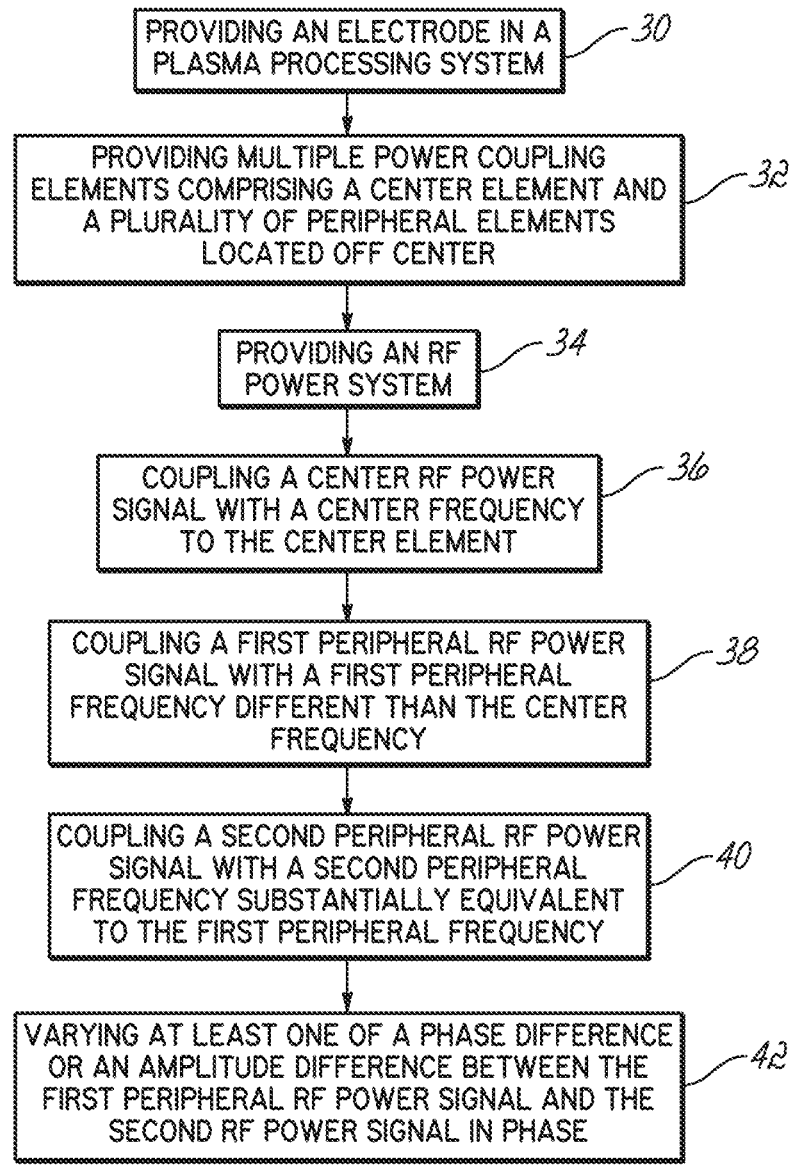
FIG. 7 is a flow chart of an embodiment of a method of the invention.

A method of operating the system 10 above is described in the flow chart of FIG. 7. In 30, an RF electrode 12 is provided in a plasma processing system, where the RF electrode 12 is configured to couple RF power to plasma in the plasma processing system. In 32, multiple power coupling elements are provided, which are configured to electrically couple RF power at multiple power coupling locations on the RF electrode 12. The multiple power coupling elements comprise a center element 14 located at the center of the RF electrode 12 and m peripheral elements 16 located off-center from the center of the RF electrode 12, where m is an integer greater than one. In 34, an RF power system 18 is provided for the multiple power coupling elements, and configured to couple an RF power signal to each of the multiple power coupling elements.

The method further includes, in 36, coupling a center RF power signal containing a center frequency to the center element 14; in 38, coupling a first peripheral RF power signal containing a first peripheral frequency to a first peripheral element 16a of the m peripheral elements; and in 40, coupling a second peripheral RF power signal containing a second peripheral frequency substantially equivalent to the first peripheral frequency to a second peripheral element 16c of the m peripheral elements. The method lastly includes, in 42, varying at least one of a phase difference or an amplitude difference between the first peripheral RF power signal and the second peripheral RF power signal in phase.

Several variables may be adjusted to improve the resultant $N_e(r)$. For example, to bring about the adjustment of $V_{RF}(r)$ to flat (or uniform), the center element 14 may be energized at arbitrary phase, with a center frequency that differs from the frequency provided to the plurality of peripheral elements 16. In general, the respective frequencies provided by the RF power system 18 to each of the plurality of peripheral elements 16a-16d is substantially the same. However, if the frequency between the center element 14 and plurality of peripheral elements 16a-16d is also permitted to be substantially the same, there is a risk that the resultant emission from the center element 14 may undesirably influence the emissions from the plurality of peripheral elements 16a-16d, or vice versa (i.e., cross-talk, or co-channel interference, may result). To prevent this phenomenon, if the frequency supplied by the RF power system 18 to the center element 14 is different from the frequency supplied to the plurality of peripheral elements 16a-16d by an amount equal to about 1% or greater, there will be no cross-talk. For example, the central element 14 could be energized at 101 MHz and the peripheral elements 16a-16d could be energized at 100 MHz, while producing acceptable results. Additionally, variations of 5% or 10% may provide acceptable results in certain configurations. As a result, the 5 phasors (the center amplitude and center phase of the center element 14, and each of the peripheral amplitudes and peripheral phases of the peripheral elements 16a-16d) will sum together to produce a flat $V_{RF}(r)$ and hence a flat IEDf(r).

Similarly, the center amplitude of the center element 14 may by adjusted independently from the peripheral amplitudes of the peripheral elements 16a-16d. While the appropriate amplitude of the center element 14 and the appropriate peripheral amplitudes of the peripheral amplitudes 16a-16d may be mathematically calculated to result in a flat $V_{RF}(r)$ and hence a flat IEDf(r), deviation from those theoretical values may be required. For example, during certain semiconductor processing procedures, it may be desirable to have some degree of asymmetry in the IEDf(r) (but less than the severe gradient that results from operation of the center element 14 alone). In those circumstances, the amplitude provided by the RF power system 18 to the center element 14, may be adjusted independently from the amplitude provided by the RF power system 18 to the plurality of peripheral elements 16a-16d, or vice versa. Similarly, physical structures within a processing chamber or varied processing environments may result in IEDf(r) irregularities that were not accounted for in mathematical models. As a result, IEDf(r) uniformity may be adjusted in-situ, during the processing of a substrate, by adjusting amplitudes of the center element 14 or the plurality of peripheral elements 16a-16d. Such independent adjustment of amplitude between the center element 14 and peripheral elements 16a-16d may be accomplished in conjunction with individual adjustment of amplitudes between the plurality of peripheral elements 16a-16d.

It should be understood that an RF signal (e.g., voltage, current, etc.) may be characterized by at least one RF phasor, and may include a superposition of multiple phasors. The RF signal coupled to at least one of the RF power coupling elements 14 or 16a-16d may be energized by RF power at a first frequency and may be characterized by a first RF phasor. The RF signal coupled to at least one of the RF power coupling elements may further include RF power at a second frequency and may be characterized by a second RF phasor. In some configurations, the second frequency may be a harmonic frequency (an integer multiple of a reference frequency) of the first frequency.

The addition of a plurality of peripheral elements 16 may introduce localized disturbances in the IEDf(r) and $N_e(r)$. However, the impact of those disturbances may be reduced by rotating the resultant $V_{RF}(r)$, either mechanically or electrically. To electrically rotate the $V_{RF}(r)$, each of the plurality of peripheral elements 16a-16d may be selectively energized or de-energized in a temporal pattern by use of a PIN diode or other appropriate RF switching network. Alternatively, another embodiment may be used to electrically rotate the $V_{RF}(r)$. First, as shown in FIG. 1, a plurality of fixed conductors 22a-22d are placed symmetrically with respect to the center element 14 and adjacent to each of the plurality of peripheral elements 16a-16d. The plurality of peripheral elements 16a-16d are continuously energized, while each of the plurality of conductors 22a-22d are selectively connected and disconnected to ground (zero potential) through an impedance load 24. Connecting each of the conductors 22a-22d to ground is similar to de-energizing the peripheral element 16 adjacent to the conductor.

Mechanical rotation may be accomplished by physically rotating the RF electrode 12, or physically rotating the substrate. Alternatively, a moveable conductor 26, similar to the fixed conductors 22a-22d used above, may either be selectively energized, or selectively tied to ground, while the moveable conductor 26 is mechanically relocated with respect to the center element 14 or the plurality of peripheral elements 16a-16d. This may be accomplished via rotation or translation. Whether selectively energized, or selectively tied to ground, the moveable conductor 26 will influence the $V_{RF}(r)$, and displace the localized irregularities as it moves. With both electrical and mechanical rotation, irregularities are smeared (distributed) azimuthally so as to reduce the localized impact on a substrate.

When approaching the upper limit of the VHF spectrum (i.e., 300 MHz), skin effects dominate. Therefore, when an RF power signal in the upper VHF range (100-300 MHz) is coupled to the center element 14, the $V_{RF}(edge)$ becomes very high, and multiple peripheral elements 16a-16d will have difficulty bringing the $V_{RF}(center)$ up. In that situation, the RF electrode 12 can be configured as a cathode (by introducing a DC bias), since a significant DC source near the substrate will raise the center $N_e(r)$. The plurality of peripheral elements 16a-16d can then be utilized to maintain a flat $V_{RF}(r)$, and a flat IEDf(r).

Conversely, when the center element 14 is energized with frequencies approaching the lower limit of the VHF spectrum (i.e., 30 MHz), standing wave properties prevail. In that configuration, with an RF power signal in the lower VHF range (30-99 MHz), center $N_e(r)$ is very high, and the plurality of peripheral elements 16a-16d can be implemented to reduce the center voltage in an attempt to bring down the center $N_e(r)$. However, under certain circumstances, it becomes necessary to reduce the center voltage sufficiently low, such that the $V_{RF}(r)$ becomes substantially non-uniform (non-uniform IEDf(r) often occurs when the center ion energy is too low). Under those circumstances, in order to achieve a flat $N_e(r)$, the system 10 will first require the implementation of the plurality of peripheral elements 16a-16d to obtain a generally flat IEDf(r), and then will require utilizing an embedded RF inductor 20, disposed adjacent the perimeter of the RF electrode 12 to generate inductively coupled plasma at the perimeter. The RF inductor's coupled plasma will supplement the edge $N_e(r)$ and yield a flat $N_e(r)$.

While the RF electrode 12 may include a lower electrode upon which a substrate rests, the RF electrode 12 to which multiple RF power coupling elements are coupled may also include an upper electrode that, for example, opposes the substrate and lower electrode. Likewise, while the embodiments illustrate circular electrodes for processing circular substrates, such as semiconductor wafers, other geometries are contemplated, such as square, rectangular, etc. Furthermore, while examples of the invention have been described with a focus on VHF applications, the apparatus and methods may be advantageously employed with any high frequency capacitively coupled plasma (CCP) in which the selected wavelength is approximately one order of magnitude compared to the electrode size (i.e., the undesirable "wavelength effect" is present).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A radio frequency (RF) power coupling system, comprising:
   an RF electrode configured to couple RF power to plasma in a plasma processing system;
   multiple power coupling elements configured to electrically couple RF power at multiple power coupling locations on said RF electrode; and
   an RF power system coupled to said multiple power coupling elements, and configured to couple an RF power signal to each of said multiple power coupling elements,
   wherein said multiple power coupling elements comprise a center element located at the center of said RF electrode and m peripheral elements located off-center from the center of said RF electrode, m being an integer greater than one,
   wherein a center RF power signal is coupled to said center element, said center RF power signal containing a center frequency,
   wherein a first peripheral RF power signal is coupled to a first peripheral element of said m peripheral elements, said first peripheral RF power signal containing a first peripheral frequency different than said center frequency by an amount equal to or less than 10% of said center frequency, wherein a second peripheral RF power signal is coupled to a second peripheral element of said m peripheral elements, said second peripheral RF power signal containing a second peripheral frequency substantially equivalent to said first peripheral frequency, and wherein the peripheral RF power signals to the m peripheral power coupling elements differ from each other in relative phase in a fixed manner and by an amount equal to 2π/m.

2. The RF power coupling system of claim 1, wherein said first peripheral element and said second peripheral element are located at power coupling locations radially positioned at a first radial location and azimuthally positioned in equally-spaced angular intervals.

3. The RF power coupling system of claim 2, including a third and a fourth peripheral element of said m peripheral elements located at a second radial location and azimuthally positioned in equally-spaced angular intervals.

4. The RF power coupling system of claim 3, wherein said first peripheral element and said third peripheral element are located on a same first radial leg, and wherein said second peripheral element and said fourth peripheral element are located on a same second radial leg.

5. The RF power coupling system of claim 3, wherein said second radial location is the same as said first radial location, and said first, second, third and fourth peripheral elements are azimuthally positioned at equally-spaced angular intervals of π/2.

6. The RF power coupling system of claim 1, wherein said m peripheral elements are located at power coupling locations radially positioned at the same radial location and azimuthally positioned in equally-spaced angular intervals.

7. The RF power coupling system of claim 1, wherein at least two of said m peripheral elements are located at power coupling locations radially positioned at different radial locations.

8. The RF power coupling system of claim 1, wherein said first peripheral frequency is less than said center frequency by an amount equal to or less than 10% of said center frequency.

9. The RF power coupling system of claim 1, wherein said first peripheral frequency differs from said center frequency by an amount equal to or less than 5% of said center frequency.

10. The RF power coupling system of claim 1, wherein at least one of said center RF power signal, said first peripheral RF power signal, and said second peripheral RF power signal contains power at an additional frequency that differs from said center frequency, said first peripheral frequency, and said second peripheral frequency, respectively.

11. The RF power coupling system of claim 10, wherein said additional frequency is a harmonic frequency of said center frequency, said first peripheral frequency, and said second peripheral frequency, respectively.

12. The RF power coupling system of claim 1, wherein said power system is configured to vary at least one of an amplitude and a phase for said center RF power signal, said first peripheral RF power signal, or said second peripheral RF power signal, as a function of time, during processing of a substrate using said RF electrode.

13. The RF power coupling system of claim 1, wherein said RF electrode comprises a plurality of segments.

14. The RF power coupling system of claim 1, wherein said RF electrode has a non-circular geometry.

15. The RF power coupling system of claim 1, including an RF inductor disposed adjacent a perimeter of said RF electrode.

16. A method of operating a radio frequency (RF) power coupling system, comprising:
    providing an RF electrode in a plasma processing system, said RF electrode configured to couple RF power to plasma in said plasma processing system;
    providing multiple power coupling elements configured to electrically couple RF power at multiple power coupling locations on said RF electrode, wherein said multiple power coupling elements comprises a center element located at the center of said RF electrode and m peripheral elements located off-center from the center of said RF electrode, m being an integer greater than one;
    providing an RF power system coupled to said multiple power coupling elements, and configured to couple an RF power signal to each of said multiple power coupling elements;
    coupling a center RF power signal to said center element, said center RF power signal containing a center frequency;
    coupling a first peripheral RF power signal to a first peripheral element of said m peripheral elements, said first peripheral RF power signal containing a first peripheral frequency different than said center frequency by an amount equal to or less than 10% of said center frequency;
    coupling a second peripheral RF power signal to a second peripheral element of said m peripheral elements, said second peripheral RF power signal containing a second peripheral frequency substantially equivalent to said first peripheral frequency; and
    varying phases between said peripheral RF power signals to the m peripheral power coupling elements so the power signals differ from each other in relative phase in a fixed manner and by an amount equal to 2π/m.

17. The method of claim 16, wherein said RF power signal is mechanically or electrically rotated.

18. The method of claim 16, wherein said RF electrode is biased with a negative direct current.

* * * * *